United States Patent
Kim

(10) Patent No.: US 11,673,075 B2
(45) Date of Patent: Jun. 13, 2023

(54) DEGASSING APPARATUS AND SUBSTRATE TREATING APPARATUS

(71) Applicant: SEMES CO., LTD., Chungcheongnam-do (KR)

(72) Inventor: Dae Sung Kim, Ansan-si (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 41 days.

(21) Appl. No.: 17/468,800

(22) Filed: Sep. 8, 2021

(65) Prior Publication Data

US 2022/0072452 A1    Mar. 10, 2022

(30) Foreign Application Priority Data

Sep. 10, 2020    (KR) .......................... 10-2020-0116370

(51) Int. Cl.
*B01D 19/00*    (2006.01)
*G03F 7/00*    (2006.01)

(52) U.S. Cl.
CPC ..... *B01D 19/0094* (2013.01); *G03F 7/70858* (2013.01)

(58) Field of Classification Search
CPC  B01D 19/0036; B01D 19/0094; B01D 19/00; B01D 19/0073; B05B 1/005; G03F 7/70341; G03F 7/70858; H01L 21/67011; H01L 21/6715
See application file for complete search history.

(56) References Cited

U.S. PATENT DOCUMENTS

| 2007/0119307 A1* | 5/2007 | Park ................ H01L 21/67017 |
| | | 96/243 |
| 2015/0096441 A1* | 4/2015 | Iseki ................ B01D 19/0063 |
| | | 96/219 |

FOREIGN PATENT DOCUMENTS

| JP | H11197406 A | 7/1999 |
| JP | H11319819 A | 11/1999 |
| JP | 2007289958 A | 11/2007 |
| JP | 2011169244 A | 9/2011 |
| JP | 2017-023990 A | 2/2017 |
| KR | 1020010068327 A | 7/2001 |
| KR | 1020080045785 A | 5/2008 |

(Continued)

OTHER PUBLICATIONS

Machine translation of JP 2011-169244, Sep. 2011.*

(Continued)

*Primary Examiner* — Peter B Kim
(74) *Attorney, Agent, or Firm* — Li & Cai Intellectual Property (USA) Office

(57) ABSTRACT

Disclosed is a degassing apparatus. The degassing apparatus includes a dissolved gas extracting nozzle that extracts dissolved gases in a form of bubbles from a treatment solution including the dissolved gases, a first tank that separates the bubbles extracted while passing through the dissolved gas extracting nozzle from the treatment solution, and a second tank having a stabilization space, in which the treatment solution, from which the bubbles have been separated, is stored from the first tank and is stabilized. The dissolved gas extracting nozzle is configured such that a diameter of an outlet is smaller than a diameter of an intermediate passage such that the dissolved gases in the treatment solution are extracted in the form of the bubbles through a cavitation phenomenon.

16 Claims, 11 Drawing Sheets

(56) References Cited

FOREIGN PATENT DOCUMENTS

| | | | |
|---|---|---|---|
| KR | 1020130135436 | A | 12/2013 |
| KR | 101440756 | B1 | 9/2014 |
| KR | 10-2017-0026952 | A | 3/2017 |
| KR | 101721794 | B1 | 3/2017 |
| WO | WO 2016093564 | A1 | 6/2016 |

OTHER PUBLICATIONS

Machine translation of JP H11-319819, Nov. 1999.*
Japan Patent Office, Office action dated Sep. 6, 2022.
Korean Patent Office, Office action dated Nov. 16, 2022.

* cited by examiner

DEGASSING APPARATUS AND SUBSTRATE TREATING APPARATUS

CROSS-REFERENCE TO RELATED APPLICATIONS

A claim for priority under 35 U.S.C. § 119 is made to Korean Patent Application No. 10-2020-0116370 filed on Sep. 10, 2020, in the Korean Intellectual Property Office, the entire contents of which are hereby incorporated by reference.

BACKGROUND

Embodiments of the inventive concept described herein relate to a degassing apparatus that removes bubbles in a treatment solution in an apparatus that treats a substrate with a treatment solution, a substrate treating apparatus, and a method for degassing a treatment solution.

In a semiconductor manufacturing process, a photolithographic process is a process of forming a desired pattern on a wafer. The photolithographic process is performed in a spinner local facility, to which an exposure facility is generally connected, and which continuously performs a deposition process, an exposure process, and a development process. The spinner local facility sequentially or selectively performs a hexamethyl disilazane (HMDS) process, an deposition process, a baking process, and a development process.

FIG. 11 is a view illustrating a treatment solution supply apparatus in a treatment apparatus that performs a general deposition process.

As shown in FIG. 11, in the existing treatment solution supply apparatus, degassing apparatuses 4 are respectively installed on supply lines 5 connecting a pump 2 and nozzles 3, and a treatment solution supplied to the nozzles 3 of liquid treating apparatuses is supplied to the nozzles 3 after bubbles are removed from the degassing apparatuses 4. A general degassing apparatus 4 used for a semiconductor process extracts bubbles by pulling a thin membrane (a gas penetrating membrane) through vacuum, and thus the thin membrane continuously receives a load and may be damaged after a specific period of time.

Furthermore, because the thin membrane (the gas penetrating membrane) is easily torn when a force of pulling the thin membrane through vacuum becomes stronger, the bubbles in the treatment solution have to be extracted with a minimum vacuum force, and thus, flow rates are limited to maintain degassing efficiency at a specific level. Accordingly, the thin membrane has to be disposed close to a discharge part (a nozzle) of a low flow rate, and an area of the thin membrane exposed to vacuum has to be maintained so that the size of the thin membrane cannot be reduced.

Further, in the degassing apparatus 4, an ejector part that controls vacuum and a vacuum pump may be damaged due to a problem of the treatment solution passing through a gas penetrating membrane in a process of removing bubbles, a separate drain pump is required.

SUMMARY

Embodiments of the inventive concept provide a degassing apparatus that may be easily maintained, a substrate treating apparatus, and a method for degassing a treatment solution.

Embodiments of the inventive concept also provide a degassing apparatus that may effectively remove dissolved gases in a treatment solution, a substrate treating apparatus, and a method for degassing a treatment solution.

Embodiments of the inventive concept also provide a degassing apparatus that may effectively remove bubbles in a treatment solution at a front end of a pump unit, a substrate treating apparatus, and a method for degassing a treatment solution.

Embodiments of the inventive concept provide a degassing apparatus that may supply a sufficient flow rate, a substrate treating apparatus, and a method for degassing a treatment solution.

The problems to be solved by the inventive concept are not limited to the above-described ones. Other technical objects that are not mentioned will be clearly understood from the following description by those skilled in the art to which the inventive concept pertains.

According to an embodiment, a degassing apparatus includes a dissolved gas extracting nozzle that extracts dissolved gases in a form of bubbles from a treatment solution including the dissolved gases, and a first tank that separates the bubbles extracted while passing through the dissolved gas extracting nozzle from the treatment solution.

Furthermore, the dissolved gas extracting nozzle may be configured such that a diameter of an intermediate passage connecting an inlet and an outlet thereof is larger than diameters of the inlet and the outlet.

Furthermore, the dissolved gas extracting nozzle may include a body having an intermediate passage, through which the treatment solution flows, in an interior thereof, an inlet, through which the treatment solution is introduced, on one side of the intermediate passage, and an outlet, through which the treatment solution is discharged, on an opposite side of the intermediate passage, and an outlet may have a cross-section that is smaller than a cross-section of the intermediate passage such that the dissolved gases in the treatment solution are extracted in the form of the bubbles through a cavitation phenomenon.

Furthermore, the first tank may include a first supply port provided at an upper end thereof, and through which the treatment solution and the bubbles are introduced, a first case having an upper space connected to the first supply port, a second case that surrounds the first case, and having an outer space, in which the treatment solution and the bubbles introduced from the upper space is separated, therebetween, and a first exhaust port located at an upper end of the outer space, and through which the bubbles separated from the treatment solution are exhausted from the outer space.

Furthermore, the first case may include first flow passages, through which the treatment solution and the bubbles flow from the upper space to the outer space, a lower space partitioned by a horizontal partition wall below the upper space, and in which the treatment solution, from which the bubbles have been removed, is stored from the outer space, and second flow passages, through which the treatment solution flows between the outer space and the lower space, at a lower end of a vertical partition wall that partitions the lower space and the outer space.

Furthermore, the first tank may further include a first discharge port, through which the treatment solution is discharged from the lower space.

The second case may further include a blocking plate installed in the outer space in a horizontal direction such that the treatment solution introduced into the outer space through the first flow passages is not introduced into the first exhaust port.

Furthermore, the degassing apparatus may further include a second tank having a stabilization space, in which the treatment solution, from which the bubbles have been separated, is stored from the first tank and is stabilized.

Furthermore, the second tank may include a second supply port provided at a lower end thereof, and through which the treatment solution, from which the bubbles have been separated, is introduced from the first tank, a second exhaust port provided at an upper end thereof, and through which the bubbles separated from the treatment solution stabilized in the stabilization space are exhausted, and a second discharge port provided at a lower end thereof, and through which the treatment solution stored in the stabilization space is discharged.

According to an embodiment, a degassing apparatus installed on a treatment solution supply line, the degassing apparatus includes a dissolved gas extracting nozzle that extracts dissolved gases in a form of bubbles from a treatment solution including the dissolved gases, and a first tank that separates the bubbles extracted while passing through the dissolved gas extracting nozzle from the treatment solution, and a second tank having a stabilization space, in which the treatment solution, from which the bubbles have been separated, is stored from the first tank and is stabilized, and the dissolved gas extracting nozzle is configured such that a diameter of an outlet is smaller than a diameter of an intermediate passage such that the dissolved gases in the treatment solution are extracted in the form of the bubbles through a cavitation phenomenon.

Furthermore, the first tank may include a first supply port provided at an upper end thereof, and through which the treatment solution and the bubbles are introduced, a first case having an upper space connected to the first supply port, and a lower space, in which the treatment solution, from which the bubbles have been removed, is stored from an outer space, a second case that surrounds the first case, and having the outer space, in which the treatment solution and the bubbles introduced from the upper space is separated, therebetween, a first exhaust port located at an upper end of the outer space, and through which the bubbles separated from the treatment solution are exhausted from the outer space, and a first discharge port provided at a lower end thereof, and through which the treatment solution stored in the lower space is discharged, and the first case may include first flow passages, through which the treatment solution and the bubbles flow from the upper space to the outer space, and second flow passages, through which the treatment solution flows between the outer space and the lower space, at a lower end of a vertical partition wall that partitions the lower space.

Furthermore, the second case may further include a blocking plate installed in the outer space in a horizontal direction such that the treatment solution introduced into the outer space through the first flow passages is not introduced into the first exhaust port.

Furthermore, the second tank may include a second supply port provided at a lower end thereof, connected to the first discharge port through a connection pipeline, and through which the treatment solution, from which the bubbles are separated, is introduced, a second exhaust port provided at an upper end thereof, and through which the bubbles separated from the treatment solution stabilized in the stabilization space are exhausted, and a second discharge port provided at a lower end thereof, and through which the treatment solution stored in the stabilization space is discharged.

According to an embodiment, a substrate treating apparatus may include treatment apparatuses that treats a substrate by using a treatment solution, and a treatment solution supply unit that supplies the treatment solution to nozzles of the treatment apparatuses, and the treatment solution supply unit includes a bottle, in which the treatment solution is stored, a degassing apparatus having a dissolved gas extracting nozzle that extracts dissolved gases from the treatment solution received from the bottle in a form of bubbles, and a pump that supplies the treatment solution stored in the degassing apparatus, from which the dissolved gases have been separated, to the nozzles of the treatment apparatuses.

Furthermore, the degassing apparatus may include a first tank that separates the bubbles extracted while passing through the dissolved gas extracting nozzle from the treatment solution, a second tank having a stabilization space, in which the treatment solution, from which the bubbles have been separated in the first tank, is stored and is stabilized, and a connection pipeline connecting a lower end of the first tank and a lower end of the second tank.

Furthermore, the dissolved gas extracting nozzle may be configured such that a diameter of an intermediate passage connecting an inlet and an outlet thereof is larger than diameters of the inlet and the outlet.

Furthermore, the first tank may include a first supply port provided at an upper end thereof, and through which the treatment solution and the bubbles are introduced, a first case having an upper space connected to the first supply port, and a lower space, in which the treatment solution, from which the bubbles have been removed, is stored from an outer space, a second case that surrounds the first case, and having the outer space, in which the treatment solution and the bubbles introduced from the upper space is separated, therebetween, and a first exhaust port located at an upper end of the outer space, and through which the bubbles separated from the treatment solution are exhausted from the outer space, and the first case may include first flow passages, through which the treatment solution and the bubbles flow from the upper space to the outer space, and second flow passages, through which the treatment solution flows between the outer space and the lower space, at a lower end of a vertical partition wall that partitions the lower space.

Furthermore, the first tank may further include a first discharge port, through which the treatment solution is discharged from the lower space.

Furthermore, the second case may further include a blocking plate installed in the outer space in a horizontal direction such that the treatment solution introduced into the outer space through the first flow passages is not introduced into the first exhaust port.

Furthermore, the second tank may include a second supply port provided at a lower end thereof, and through which the treatment solution, from which the bubbles are separated, is introduced from the first tank, a second exhaust port provided at an upper end thereof, and through which the bubbles separated from the treatment solution stabilized in the stabilization space are exhausted, and a second discharge port provided at a lower end thereof, and through which the treatment solution stored in the stabilization space is discharged.

According to an embodiment, a method for degassing a treatment solution includes extracting dissolved gases in a form of bubbles from a treatment solution including the dissolved gases through a dissolved gas extracting nozzle, separating the bubbles extracted in a first tank from the treatment solution, and performing stabilization by receiving the treatment solution, from which the bubbles have been separated in the first tank, and storing the received treatment solution at a second tank.

Furthermore, in the extracting of the dissolved gases, the dissolved gases in the treatment solution may be extracted in the form of the bubbles through the cavitation phenomenon.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
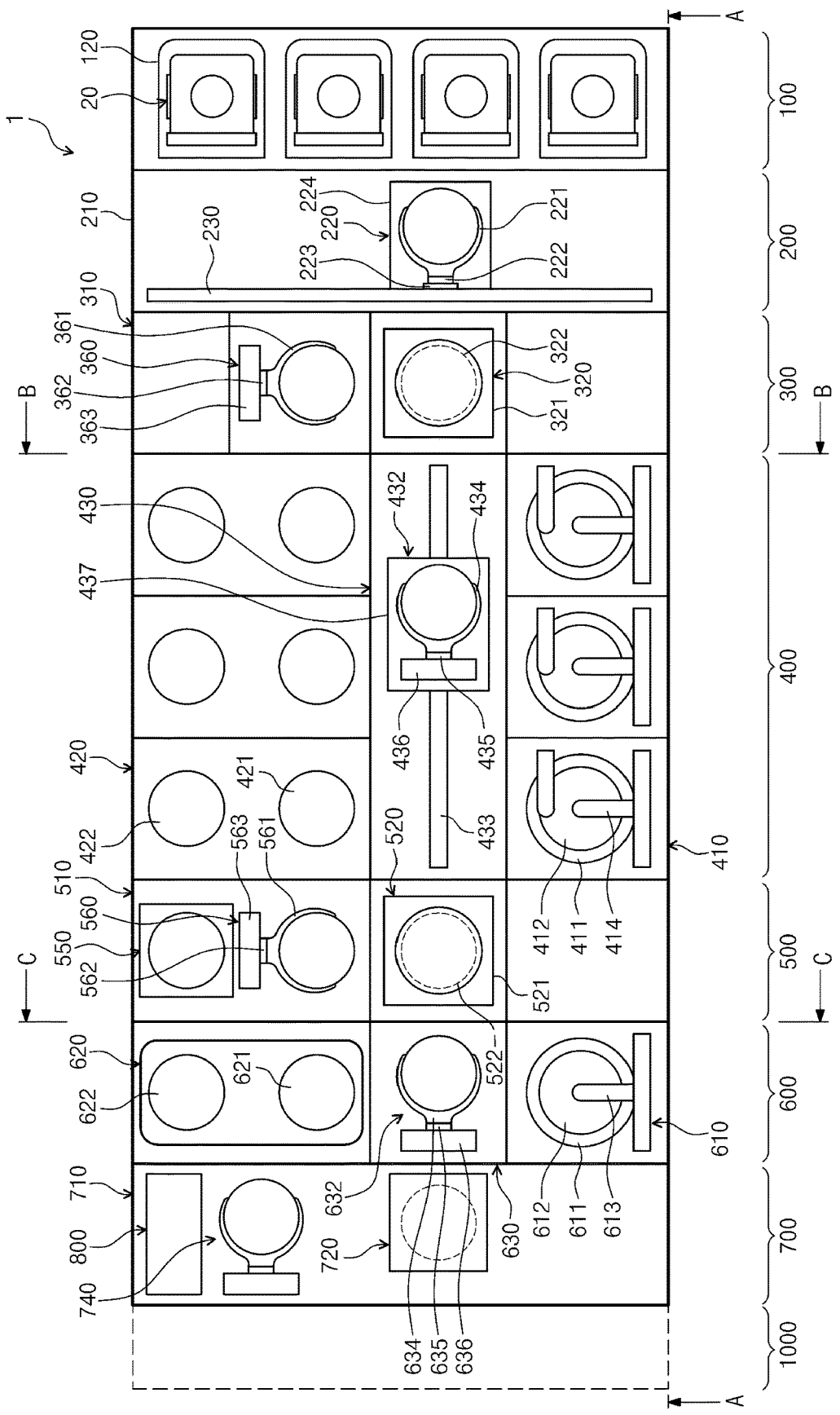
FIG. 1 is a plan view of a substrate treating facility according to a first embodiment of the inventive concept.

Hereinafter, exemplary embodiments of the inventive concept will be described in detail with reference to the accompanying drawings so that those skilled in the art to which the inventive concept pertains may easily carry out the inventive concept. However, the inventive concept may be implemented in various different forms, and is not limited to the embodiments. Furthermore, in a description of the embodiments of the inventive concept, a detailed description of related known functions or configurations will be omitted when they make the essence of the inventive concept unnecessarily unclear. In addition, the same reference numerals are used for parts that perform similar functions and operations throughout the drawings.

The expression of 'including' some elements may mean that another element may be further included without being excluded unless there is a particularly contradictory description. In detail, the terms "including" and "having" are used to designate that the features, the numbers, the steps, the operations, the elements, the parts, or combination thereof described in the specification are present, and may be understood that one or more other features, numbers, step, operations, elements, parts, or combinations thereof may be added.

The terms such as first and second may be used to describe various elements, but the elements are not limited to the terms. The terms may be used only for the purpose of distinguishing one element from another element. For example, without departing the scope of the inventive concept, a first element may be referred to as a second element, and similarly, a second element may be referred to as a first element.

The terms of a singular form may include plural forms unless otherwise specified. Furthermore, in the drawings, the shapes and sizes of the elements may be exaggerated for clearer description.

The system of the present embodiment of the inventive concept may be used to perform a photography process on a substrate such as a semiconductor substrate or a flat display panel. In particular, the system of the present embodiment may be connected to an exposure apparatus to perform an deposition process and a development process on a substrate. Hereinafter, a case of using a wafer as a substrate may be described as an example.

Hereinafter, a substrate treating facility of the inventive concept will be described with reference to FIGS. 1 to 7.

Figure 2:
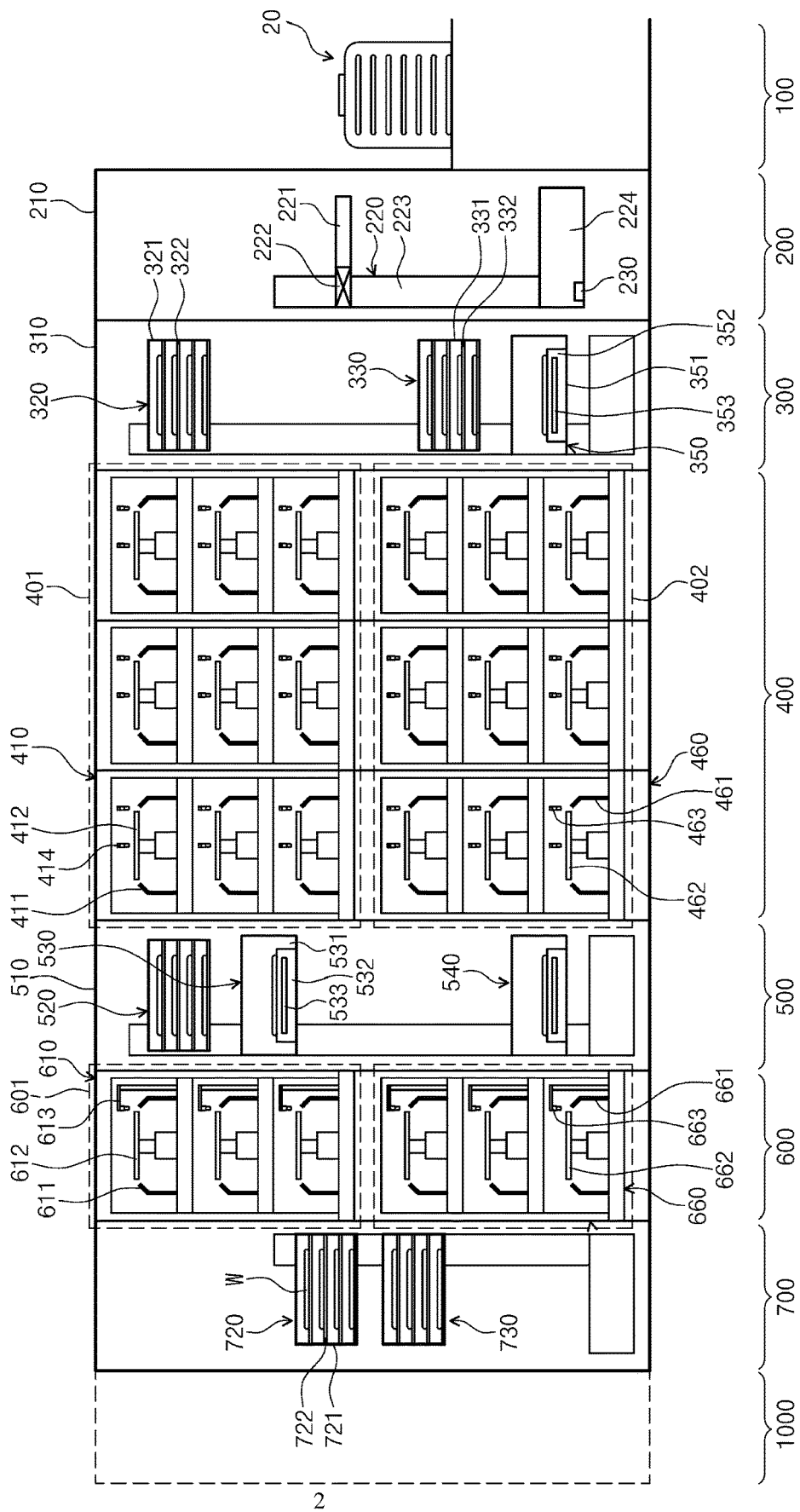
FIG. 2 is a cross-sectional view of the facility of FIG. 1, taken along line A-A of FIG. 1.
Figure 3:
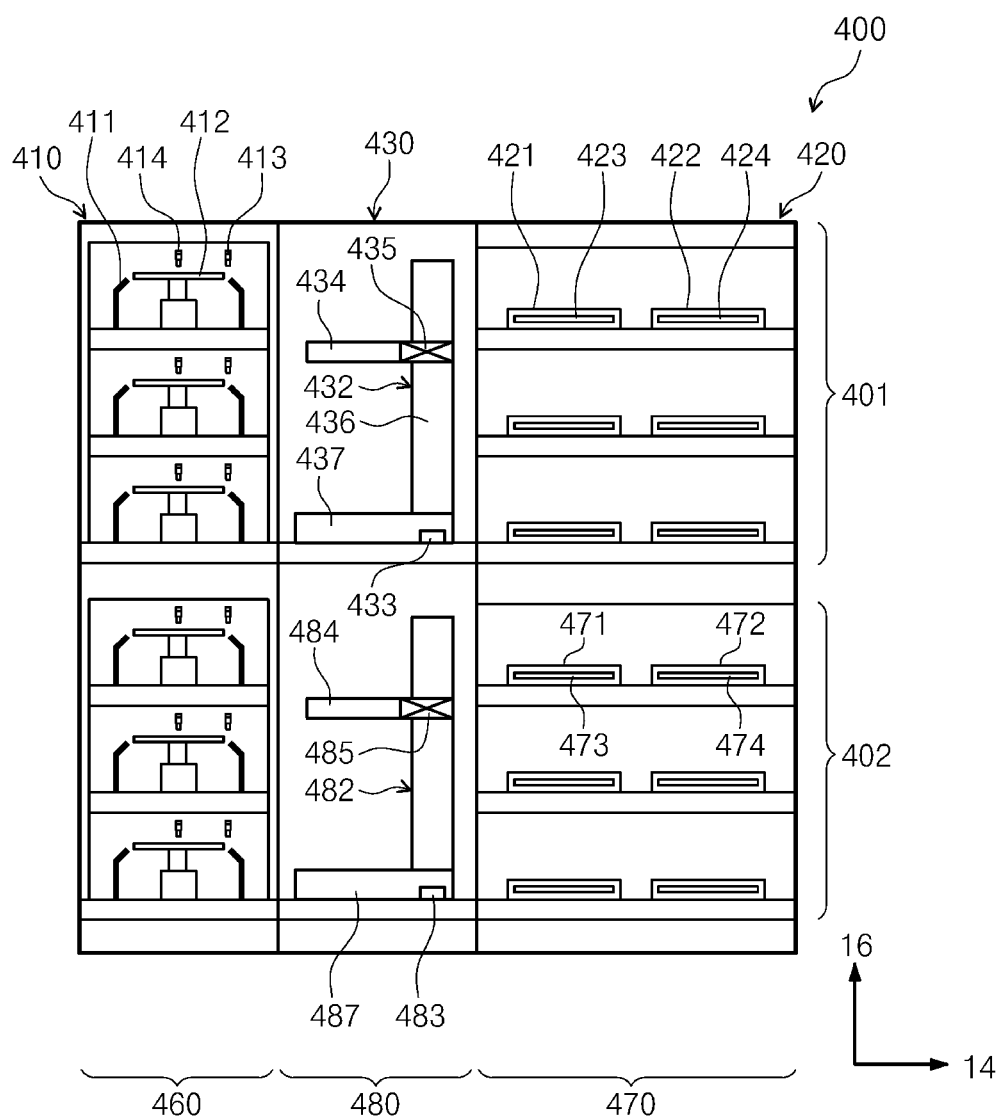
FIG. 3 is a cross-sectional view of the system of FIG. 1, taken along line B-B of FIG. 1.
Figure 4:
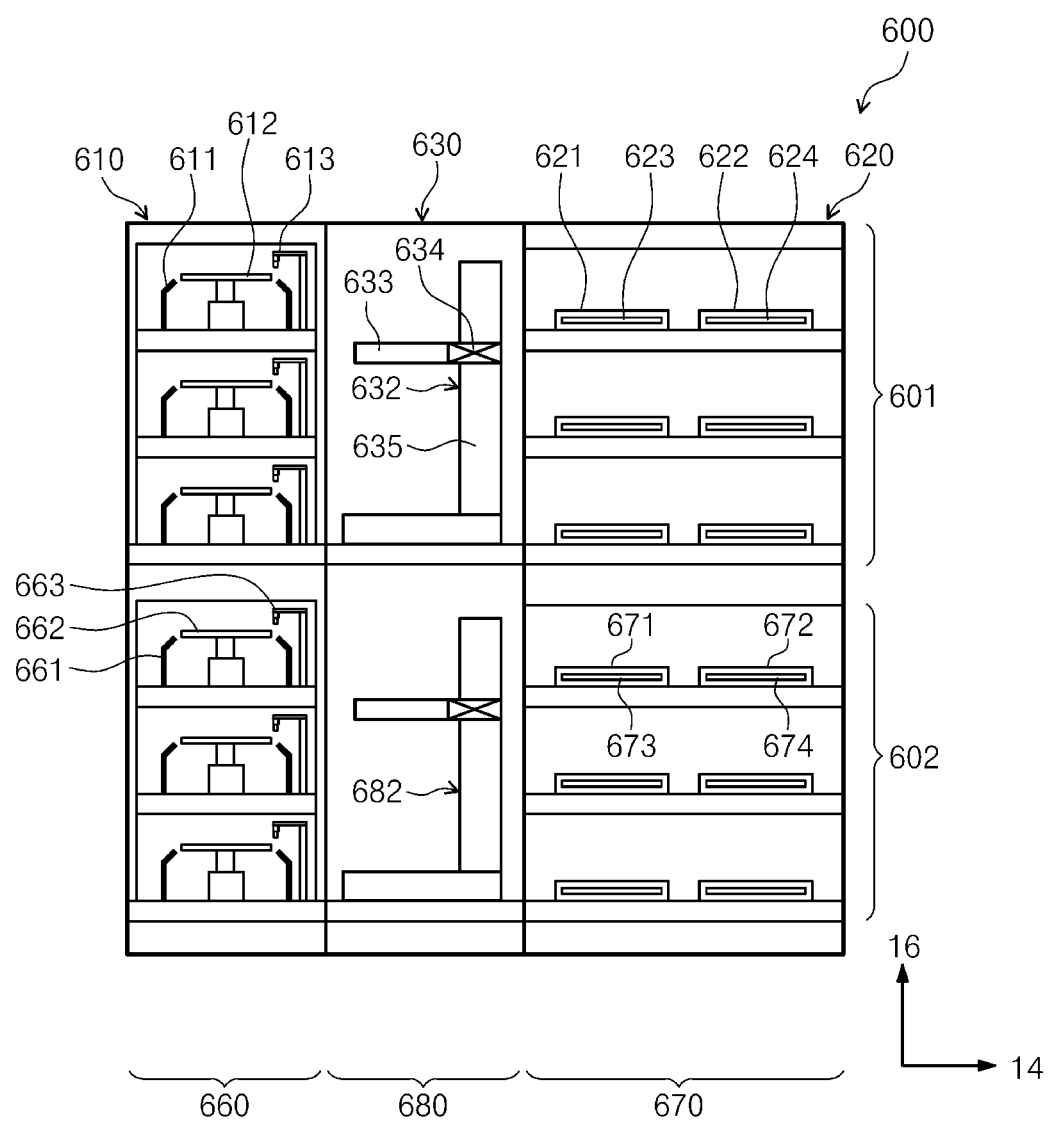
FIG. 4 is a cross-sectional view of the system of FIG. 1, taken along a line C-C of FIG. 2.

FIG. 1 is a view of a substrate treating facility when viewed from a top. FIG. 2 is a sectional view of the facility of FIG. 1, taken along line A-A of FIG. 1. FIG. 3 is a sectional view of the system of FIG. 1, taken along line B-B of FIG. 1. FIG. 4 is a sectional view of the system of FIG. 1, taken along a line C-C of FIG. 2.

Referring to FIGS. 1 to 4, a substrate treating facility 1 may include a load port 100, an index module 200, a first buffer module 300, a deposition/development module 400, a second buffer module 500, a pre/post-exposure treating module 600, and an interface module 700.

The load port 100, the index module 200, the first buffer module 300, the deposition/development module 400, the second buffer module 500, the pre/post-exposure treating module 600, and the interface module 700 may be sequentially disposed in a row in one direction.

Hereinafter, a direction in which the load port 100, the index module 200, the first buffer module 300, the deposition/development module 400, the second buffer module 500, the pre/post-exposure treating module 600, and the interface module 700 are disposed will be referred to as a first direction 12, and a direction that is perpendicular to the first direction 12 when viewed from the top will be referred to as a second direction 14, and a direction that is perpendicular to the first direction 12 and the second direction 14 will be referred to as a third direction 16.

A substrate "W" is moved while being received in a cassette 20. Then, the cassette 20 has a structure that is sealed from the outside. For example, a front open unified pod (FOUP) that has a door on the front side may be used as the cassette 20.

Hereinafter, the load port 100, the index module 200, the first buffer module 300, the deposition/development module 400, the second buffer module 500, the pre/post-exposure treating module 600, and the interface module 700 will be described in detail.

The load port 100 has a carrier 120 on which the cassette 20, in which the substrates "W" are received, is positioned. A plurality of carriers 120 are provided, and are disposed along the second direction 14 in a row. In FIG. 1, four carriers 120 are provided.

The index module 200 feeds a substrate "W" between the cassette 20 positioned on the carrier 120 of the load port 100 and the first buffer module 300. The index module 200 has a frame 210, an index robot 220, and a guide rail 230. The frame 210 has a substantially rectangular parallelepiped shape having an empty interior, and is disposed between the load port 100 and the first buffer module 300. The frame 210 of the index module 200 may have a height smaller than that of a frame 310 of the first buffer module 300, which will be described below. The index robot 220 and the guide rail 230 are disposed in the frame 210. The index robot 220 has a four-axis driven structure such that a hand 221 that directly handles a substrate "W" is movable and rotatable in the first direction 12, the second direction 14, and the third direction 16. The index robot 220 has the hand 221, an arm 222, a support 223, and a prop 224. The hand 221 is fixedly installed in the arm 222. The arm 222 has a flexible and rotatable structure. The support 223 is configured such that the lengthwise direction thereof is disposed along the third direction 16. The arm 222 is coupled to the support 223 to be movable along the support 223. The support 223 is fixedly coupled to the prop 224. The guide rail 230 is provided such that the lengthwise direction thereof is disposed along the second direction 14. The prop 224 is coupled to the guide rail 230 to be linearly movable along the guide rail 230. Although not illustrated, the frame 210 is further provided with a door opener that opens and closes a door of the cassette 20.

The first buffer module 300 has the frame 310, a first buffer 320, a second buffer 330, a cooling chamber 350, and a first buffer robot 360. The frame 310 has a rectangular parallelepiped shape having an empty interior, and is disposed between the index module 200 and the deposition/development module 400. The first buffer 320, the second buffer 330, the cooling chamber 350, and the first buffer robot 360 are situated within the frame 310. The cooling chamber 350, the second buffer 330, and the first buffer 320 are disposed along the third direction 16 sequentially from the bottom. The first buffer 320 is situated at a height corresponding to a deposition module 401 of the deposition/development module 400, which will be described below, and the second buffer 330 and the cooling chamber 350 are situated at a height corresponding to a development module 402 of the deposition/development module 400, which will be described below. The first buffer robot 360 is spaced apart by a predetermined distance in the second direction 14 from the second buffer 330, the cooling chamber 350, and the first buffer 320.

The first buffer 320 and the second buffer 330 temporarily preserve a plurality of substrates "W". The second buffer 330 has a housing 331 and a plurality of supports 332. The supports 332 are disposed within the housing 331, and are spaced apart from one another along the third direction 16. One substrate "W" is positioned on each of the supports 332. The housing 331 has openings (not illustrated) on a side on which the index robot 220 is provided, on a side on which the first buffer robot 360 is provided, and on a side on which a development robot 482 is provided so that the index robot 220, the first buffer robot 360, and the development robot 482 of the development module 402, which will be described below, carries a substrate "W" into or out of the support 332 in the housing 331. The first buffer 320 has a structure that is substantially similar to that of the second buffer 330. Meanwhile, a housing 321 of the first buffer 320 has an opening on a side on which the first buffer robot 360 is provided and on a side on which a deposition robot 432 situated in the deposition module 401, which will be described below, is provided. The number of supports 322 provided for the first buffer 320 and the number of supports 332 provided for the second buffer 330 may be the same or different. According to an embodiment, the number of supports 332 provided for the second buffer 330 may be larger than the number of the supports 332 provided for the first buffer 320.

The first buffer robot 360 transfers a substrate "W" between the first buffer 320 and the second buffer 330. The first buffer robot 360 has a hand 361, an arm 362, and a support 363. The hand 361 is fixedly installed in the arm 362. The arm 362 has a flexible structure, and allows the hand 361 to be moved along the second direction 14. The arm 362 is coupled to the support 363 to be linearly movable in the third direction 16 along the support 363. The support 363 has a length extending from a location corresponding to the second buffer 330 to a location corresponding to the first buffer 320. The support 363 may be provided to extend longer upwards or downwards. The first buffer robot 360 may be provided such that the hand 361 is simply two-axis driven along the second direction 14 and the third direction 16.

The cooling chamber 350 cools a substrate "W". The cooling chamber 350 has a housing 351 and a cooling plate 352. The cooling plate 352 has a cooling unit 353 that cools an upper surface thereof on which a substrate "W" is positioned and the substrate "W". Various types such as a cooling type using cooling water and a cooling type using a thermoelectric element may be used as the cooling unit 353. A lift pin assembly (not illustrated) that locates a substrate "W" on the cooling plate 352 may be provided in the cooling chamber 350. The housing 351 has openings (not illustrated) on a side on which the index robot 220 is provided and on a side on which the development robot 482 is provided so that the index robot 220 and the development robot 482 provided for the development module 402, which will be described below, carry a substrate "W" into or out of the cooling plate 352. Doors (not illustrated) that open and close the aforementioned openings may be provided in the cooling chamber 350.

The deposition/development module 400 performs a process of applying a photoresist onto a substrate "W" before an exposure process and a process of developing the substrate "W" after the exposure process. The deposition/development module 400 has a substantially rectangular parallelepiped shape. The deposition/development module 400 has the deposition module 401 and the development module 402. The deposition module 401 and the development module 402 may be disposed to be partitioned from each other in different layers. According to an example, the deposition module 401 is situated on the development module 402.

The deposition module 401 performs a process of applying a photosensitive liquid such as a photoresist onto a substrate "W" and a heat treating process of, for example, heating and cooling the substrate "W" before and after the resist applying process. The deposition module 401 has a resist applying chamber 410, a bake chamber 420, and a transfer chamber 430. The resist applying chamber 410, the bake chamber 420, and the transfer chamber 430 are sequentially disposed along the second direction 14. Accordingly, the resist applying chamber 410 and the bake chamber 420 are spaced apart from each other in the second direction 14 while the transfer chamber 430 is interposed therebetween. A plurality of resist applying chambers 410 may be provided, and a plurality of resist applying chambers 410 may be provided in each of the first direction 12 and the third direction 16. In the drawings, six resist applying chambers 410 are illustrated as an example. A plurality of bake chamber 420 may be provided in each of the first direction 12 and the third direction 16. In the drawings, six bake chambers 420 are illustrated as an example. However, unlike this, a larger number of bake chambers 420 may be provided.

The transfer chamber 430 is situated in parallel to the first buffer 320 of the first buffer module 300 in the first direction 12. The deposition robot 432 and a guide rail 433 may be situated in the transfer chamber 430. The transfer chamber 430 has a substantially rectangular shape. The deposition robot 432 feeds a substrate "W" between the bake chambers 420, the resist applying chambers 410, the first buffer 320 of the first buffer module 300, and a first cooling chamber 520 of the second buffer module 500. The guide rail 433 is disposed such that the lengthwise direction thereof is parallel to the first direction 12. The guide rail 433 is disposed such that the lengthwise direction thereof is parallel to the first direction 12. The deposition robot 432 has a hand 434, an arm 435, a support 436, and a prop 437. The hand 434 is fixedly installed in the arm 435. The arm 435 has a flexible structure such that the hand 434 is movable horizontally. The support 436 is provided such that the lengthwise direction thereof is disposed along the third direction 16. The arm 435 is coupled to the support 436 to be linearly movable in the third direction 16 along the support 436. The support 436 is fixedly coupled to the prop 437, and the prop 437 is coupled to the guide rail 433 to be movable along the guide rail 433.

The resist applying chambers 410 have the same structure. However, the types of photoresists used in the resist applying chambers 410 may be different. As an example, the photoresist may be a chemical amplification resist. The resist applying chamber 410 applies a photoresist onto the substrate "W".

The resist applying chamber 410 has a housing 411, a support plate 412, and a nozzle 413. The housing 411 has an open-topped cup shape. The support plate 412 is situated in the housing 411, and supports the substrate "W". The support plate 412 may be provided to be rotatable. The nozzle 413 supplies a photoresist onto the substrate "W" positioned on the support plate 412. The nozzle 413 has a circular pipe shape, and may supply a photoresist to the center of the substrate "W". Optionally, the nozzle 413 may have a length corresponding to the diameter of the substrate "W", and the outlet of the nozzle 413 may be a slit. Further, additionally, a nozzle 414 for supplying a cleaning liquid such as deionized water to clean a surface of the substrate "W", to which the photoresist is applied, may be further provided in the resist applying chamber 410.

Referring back to FIGS. 1 to 4, the bake chamber 420 heat-treats the substrate "W". For example, the bake chambers 420 perform a prebake process of eliminating organic substances and moisture on the surface of the substrate "W" by heating the substrate "W" at a predetermined temperature before a photoresist is applied or a soft bake process performed after a photoresist is applied onto the substrate "W", and performs a cooling process of cooling the substrate "W" after the heating processes. The bake chamber 420 has a cooling plate 421 and a heating plate 422. The cooling plate 421 is provided with a cooling unit 423 such as cooling water or a thermoelectric element. The heating plate 422 is provided with a heating unit 424 such as a heating wire or a thermoelectric element. The cooling plate 421 and the heating plate 422 may be provided in one bake chamber 420. Optionally, some of the bake chambers 420 may include only the cooling plate 421, and some of the bake chambers 422 may include only the heating plate 422.

The development module 402 includes a process of eliminating a photoresist by supplying a development liquid on the substrate "W" to obtain a pattern, and a heat treating process, such as heating and cooling, which are performed on the substrate "W" before and after the development process. The development module 402 has a development chamber 460, a bake chamber 470, and a transfer chamber 480. The development chamber 460, the bake chamber 470, and the transfer chamber 480 are sequentially disposed along the second direction 14. Accordingly, the development chamber 460 and the bake chamber 470 are spaced apart from each other in the second direction 14 while the transfer chamber 480 is interposed therebetween. A plurality of development chambers 460 may be provided, and a plurality of development chambers 460 may be provided in each of the first direction 12 and the third direction 16. In the drawings, six development chambers 460 are illustrated as an example. A plurality of bake chamber 470 may be provided in each of the first direction 12 and the third direction 16. In the drawings, six bake chambers 470 are illustrated as an example. However, unlike this, a larger number of bake chambers 470 may be provided.

The transfer chamber 480 is situated in parallel to the second buffer 330 of the first buffer module 300 in the first direction 12. The development robot 482 and a guide rail 483 may be situated in the transfer chamber 480. The transfer chamber 480 has a substantially rectangular shape. The development robot 482 feeds the substrate "W" between the bake chambers 470, the development chambers 460, the second buffer 330 and the cooling chamber 350 of the first buffer module 300, and a second cooling chamber 540 of the second buffer module 500. The guide rail 483 is disposed such that the lengthwise direction thereof is parallel to the first direction 12. The guide rail 483 guides the development robot 482 such that the development robot 482 is linearly moved in the first direction 12. The development robot 482 has a hand 484, an arm 485, a support 486, and a prop 487. The hand 484 is fixedly installed in the arm 485. The arm 485 has a flexible structure such that the hand 484 is movable horizontally. The support 486 is provided such that the lengthwise direction thereof is disposed along the third direction 16. The arm 485 is coupled to the support 486 to be linearly movable in the third direction 16 along the support 486. The support 486 is fixedly coupled to the prop 487. The prop 487 is coupled to the guide rail 483 to be linearly movable along the guide rail 483.

The development chambers 460 have the same structure. However, the types of development liquids used in the development chambers 460 may be different. The development chambers 460 eliminate an area of the photoresist on the substrate "W", to which light is irradiated. Then, an area of the protective film, to which light is irradiated, is eliminated together. Optionally, only an area of the photoresist and the protective film, to which light is not irradiated, may be eliminated according to the type of the used photoresist.

The development chamber 460 has a housing 461, a support plate 462, and a nozzle 463. The housing 461 has an open-topped cup shape. The support plate 462 is situated in the housing 461, and supports the substrate "W". The support plate 462 may be provided to be rotatable. The nozzle 463 supplies a development liquid onto the substrate "W" positioned on the support plate 462. The nozzle 463 may have a circular pipe shape, and may supply a development liquid to the center of the substrate "W". Optionally, the nozzle 463 may have a length corresponding to the diameter of the substrate "W", and the outlet of the nozzle 463 may be a slit. The development chamber 460 may be further provided with a nozzle 464 that supplies a cleaning liquid such as deionized water to clean the surface of the substrate "W", to which the development liquid is additionally supplied.

The bake chamber 470 of the development module 402 heat-treats the substrate "W". For example, the bake chambers 470 may perform a post bake process of heating the substrate "W" before the development process, a hard bake process of heating the substrate "W" after the development process, and a cooling process of cooling the heated wafer after the bake process. The bake chamber 470 has a cooling plate 471 and a heating plate 472. The cooling plate 471 is provided with a cooling unit 473 such as cooling water or a thermoelectric element. The heating plate 472 is provided with a heating unit 474 such as a heating wire or a thermoelectric element. The cooling plate 471 and the heating plate 472 may be provided in one bake chamber 470. Optionally, some of the bake chambers 470 may include only the cooling plate 471, and some of the bake chambers 470 may include only the heating plate 472.

As described above, the deposition/development module 400 is provided such that the deposition module 401 and the development module 402 are separated. When viewed from the top, the deposition module 401 and the development module 402 may have the same chamber disposition.

The second buffer module 500 is provided as a passage through which the substrate "W" is transported, between the deposition/development module 400 and the pre/post-exposure module 600. The second buffer module 500 performs a process such as a cooling process or an edge exposing process on the substrate "W". The second buffer module 500 has a frame 510, a buffer 520, a first cooling chamber 530, the second cooling chamber 540, an edge exposing chamber 550, and a second buffer robot 560. The frame 510 has a rectangular parallelepiped shape. The buffer 520, the first cooling chamber 530, the second cooling chamber 540, the edge exposing chamber 550, and the second buffer robot 560 are situated in the frame 510. The buffer 520, the first cooling chamber 530, and the edge exposing chamber 550 are disposed at a height corresponding to the deposition module 401. The second cooling chamber 540 is disposed at a height corresponding to the development module 402. The buffer 520, the first cooling chamber 530, and the second cooling chamber 540 are disposed in a row along the third direction 16. When viewed from the top, the buffer 520 is disposed along the transfer chamber 430 of the deposition module 401 in the first direction 12. The edge exposing chamber 550 is spaced apart from the buffer 520 or the first cooling chamber 530 by a predetermined distance in the second direction 14.

The second buffer robot 560 transports the substrate "W" between the buffer 520, the first cooling chamber 530, and the edge exposing chamber 550. The second buffer robot 560 is situated between the edge exposing chamber 550 and the buffer 520. The second buffer robot 560 may have a structure that is similar to that of the first buffer robot 360. The first cooling chamber 530 and the edge exposing chamber 550 perform a succeeding process on the wafers "W", on which the deposition module 401 has performed a process. The first cooling chamber 530 cools the substrate "W", on which the deposition module 401 has performed a process. The first cooling chamber 530 has a structure similar to that of the cooling chamber 350 of the first buffer module 300. The edge exposing chamber 550 exposes peripheries of the wafers "W", on which the first cooling chamber 530 has performed a cooling process. The buffer 520 temporarily preserves the substrates "W" before the substrates "W", on which the edge exposing chamber 550 has performed a process, are transported to a pre-treatment module 601, which will be described below. The second cooling chamber 540 cools the wafers "W" before the wafers "W", on which a post-treatment module 602, which will be described below, has performed a process, are transported to the development module 402. The second buffer module 500 may further have a buffer at a height corresponding to the development module 402. In this case, the wafers "W", on which the post-treatment module 602 has performed a process, may be transported to the development module 402 after being temporarily preserved in the added buffer.

When an exposure apparatus 1000 performs an immersion/exposure process, the pre/post-exposure module 600 may perform a process of applying a protective film that protects the photoresist film applied to the substrate "W" during the immersion/exposure process. The pre/post-exposure module 600 may perform a process of cleaning the substrate "W" after the exposure process. Furthermore, when the deposition process is performed by using a chemical amplification resist, the pre/post-exposure module 600 may perform a bake process after the exposure process.

The pre/post-exposure module 600 has the pre-treatment module 601 and the post-treatment module 602. The pre-treatment module 601 performs a process of treating the substrate "W" before the exposure process, and the post-treatment module 602 performs a process of treating the substrate "W" after the exposure process. The pre-treatment module 601 and the post-treatment module 602 may be disposed to be partitioned from each other in different layers. According to an example, the pre-treatment module 601 is situated on the post-treatment module 602. The pre-treatment module 601 has the same height as that of the deposition module 401. The post-treatment module 602 has the same height as that of the development module 402. The pre-treatment module 601 has a protective film applying chamber 610, a bake chamber 620, and a transfer chamber 630. The protective film applying chamber 610, the transfer chamber 630, and the bake chamber 620 are sequentially disposed along the second direction 14. Accordingly, the protective film applying chamber 610 and the bake chamber 620 are spaced apart from each other in the second direction 14 while the transfer chamber 630 is interposed therebetween. A plurality of protective film applying chambers 610 are provided, and the plurality of protective film applying chambers 610 are disposed along the third direction 16 to form different layers. Optionally, a plurality of protective film applying chambers 610 may be provided in each of the first direction 12 and the third direction 16. A plurality of bake chambers 620 are provided, and the plurality of bake chambers 610 are disposed along the third direction 16 to form different layers. Optionally, a plurality of bake chambers 620 may be provided in each of the first direction 12 and the third direction 16.

The transfer chamber 630 is situated in parallel to the first cooling chamber 530 of the second buffer module 500 in the first direction 12. A pre-treatment robot 632 is situated in the transfer chamber 630. The transfer chamber 630 has a substantially square or rectangular shape. The pre-treatment robot 632 feeds the substrate "W" between the protective film applying chambers 610, the bake chambers 620, the buffer 520 of the second buffer module 500, and a first buffer 720 of the interface module 700, which will be described below. The pre-treatment robot 632 has a hand 633, an arm 634, and a support 635. The hand 633 is fixedly installed in the arm 634. The arm 634 has a flexible and rotatable structure. The arm 634 is coupled to the support 635 to be linearly movable in the third direction 16 along the support 635.

The protective film applying chamber 610 applies a protective film that protects a resist film during the immersion/exposure process, onto the substrate "W". The protective film applying chamber 610 has a housing 611, a support plate 612, and a nozzle 613. The housing 611 has an open-topped cup shape. The support plate 612 is situated in the housing 611, and supports the substrate "W". The support plate 612 may be provided to be rotatable. The nozzle 613 supplies a protection liquid for forming a protective film onto the substrate "W" positioned on the support plate 612. The nozzle 613 has a circular pipe shape, and may supply a protection liquid to the center of the substrate "W". Optionally, the nozzle 613 may have a length corresponding to the diameter of the substrate "W", and the outlet of the nozzle 613 may be a slit. In this case, the support plate 612 may be provided in a fixed state. The protection liquid includes an expandable material. The protection liquid may be a material that has a low affinity for a photoresist and water. For example, the protection liquid may include a fluorine-based solvent. The protective film applying chamber 610 supplies a protection liquid to a central area of the substrate "W" while rotating the substrate "W" positioned on the support plate 612.

The bake chamber 620 heat-treats the substrate "W", to which the protective film is applied. The bake chamber 620 has a cooling plate 621 and a heating plate 622. The cooling plate 621 is provided with a cooling unit 623 such as cooling water or a thermoelectric element. The heating plate 622 is provided with a heating unit 624 such as a heating wire or a thermoelectric element. The heating plate 622 and the cooling plate 621 may be provided in one bake chamber 620. Optionally, some of the bake chambers 620 may include only the heating plate 622, and some of the bake chambers 620 may include only the cooling plate 621.

The post-treatment module 602 has a cleaning chamber 660, a post-exposure bake chamber 670, and a transfer chamber 680. The cleaning chamber 660, the transfer chamber 680, and the post-exposure bake chamber 670 are sequentially disposed along the second direction 14. Accordingly, the cleaning chamber 660 and the post-exposure bake chamber 670 are spaced apart from each other in the second direction 14 while the transfer chamber 680 is interposed therebetween. A plurality of cleaning chambers 660 are provided, and the plurality of cleaning chambers 610 are disposed along the third direction 16 to form different layers. Optionally, a plurality of cleaning chambers 660 may be provided in each of the first direction 12 and the third direction 16. A plurality of post-exposure bake chambers 670 are provided, and the plurality of post-exposure bake chambers 670 are disposed along the third direction 16 to form different layers. Optionally, a plurality of post-exposure bake chambers 670 may be provided in each of the first direction 12 and the third direction 16.

When viewed from the top, the transfer chamber 680 is situated in parallel to the second cooling chamber 540 of the second buffer module 500 in the first direction 12. The transfer chamber 680 has a substantially square or rectangular shape. A post-treatment robot 682 is situated in the transfer chamber 680. The post-treatment robot 682 transports the substrate "W" between the cleaning chambers 660, the post-exposure bake chambers 670, the second cooling chamber 540 of the second buffer module 500, and a second buffer 730 of the interface module 700, which will be described below. The post-treatment robot 682 provided in the post-treatment module 602 may have the same structure as that of the pre-treatment robot 632 provided in the pre-treatment module 601.

The cleaning chamber 660 cleans the substrate "W" after the exposure process. The cleaning chamber 660 has a housing 661, a support plate 662, and a nozzle 663. The housing 661 has an open-topped cup shape. The support plate 662 is situated in the housing 661, and supports the substrate "W". The support plate 662 may be provided to be rotatable. The nozzle 663 supplies a cleaning liquid onto the substrate "W" positioned on the support plate 662. The cleaning liquid may be water such as deionized water. The cleaning chamber 660 supplies a cleaning liquid to a central area of the substrate "W" while rotating the substrate "W" positioned on the support plate 662. Optionally, the nozzle 663 may be linearly moved or rotated from a central area to a peripheral area of the substrate "W" while the substrate "W" is rotated.

After the exposure process, the post-exposure bake chamber 670 heats the substrate "W", on which the exposure process has been performed, by using a far infrared ray. After the exposure process, in the bake process, the substrate "W" is heated to finish a property change of the photoresist by amplifying acid produced in the photoresist through the exposure process. The post-exposure bake chamber 670 has a heating plate 672. The heating plate 672 is provided with a heating unit 674 such as a heating wire or a thermoelectric element. The post-exposure bake chamber 670 may be further provided with a cooling plate 671 in the interior thereof. The cooling plate 671 is provided with a cooling unit 673 such as cooling water or a thermoelectric element. Optionally, a bake chamber having only the cooling plate 671 may be further provided.

As described above, the pre/post-exposure module 600 is provided such that the pre-treatment module 601 and the post-treatment module 602 are completely separated from each other. The transfer chamber 630 of the pre-treatment module 601 and the transfer chamber 680 of the post-treatment module 602 may have the same size, and may completely overlap each other when viewed from the top. The protective film applying chamber 610 and the cleaning chamber 660 may have the same size, and may completely overlap with each other when viewed from the top. The bake chamber 620 and the post-exposure bake chamber 670 may have the same size, and may completely overlap with each other when viewed from the top.

The interface module 700 feeds the substrate "W" between the pre/post-exposure module 600 and the exposure apparatus 1000. The interface module 700 has a frame 710, the first buffer 720, the second buffer 730, and an interface robot 740. The first buffer 720, the second buffer 730, and the interface robot 740 are situated within the frame 710. The first buffer 720 and the second buffer 730 are spaced apart from each other by a predetermined distance, and may be stacked. The first buffer 720 is disposed at a location higher than the second buffer 730. The first buffer 720 is situated at a height corresponding to the pre-treatment module 601, and the second buffer 730 is disposed at a height corresponding to the post-treatment module 602. When viewed from the top, the first buffer 720 is disposed along the first direction 12 while forming a row with the transfer chamber 630 of the pre-treatment module 601, and the second buffer 730 is disposed along the first direction 12 forming a row with the transfer chamber 630 of the post-treatment module 602.

The interface robot 740 is situated to be spaced apart from the first buffer 720 and the second buffer 730 in the second direction 14. The interface robot 740 transports the substrate "W" between the first buffer 720, the second buffer 730, and the exposure apparatus 1000. The interface robot 740 has a structure that is substantially similar to that of the second buffer robot 560.

The first buffer 720 temporarily preserves the substrates "W", on which the pre-treatment module 601 has performed a process, before they are moved to the exposure apparatus 1000. The second buffer 730 temporarily preserves the substrates "W", on which the exposure apparatus 1000 has completely performed a process, before they are moved to the post-treatment module 602. The first buffer 720 has a housing 721 and a plurality of supports 722. The supports 722 are disposed within the housing 721, and are spaced apart from one another along the third direction 16. One substrate "W" is positioned on each of the supports 722. The housing 721 has openings (not illustrated) on a side on which the interface robot 740 is provided and on a side on which the pre-treatment robot 632 is provided so that the interface robot 740 and the pre-treatment robot 632 carry a substrate "W" into or out of the supports 722. The second buffer 730 has a structure that is substantially similar to that of the first buffer 720. Meanwhile, the housing 4531 of the second buffer 730 has openings on a side on which the interface robot 740 is provided and on a side on which the post-treatment robot 682 is provided. The interface module may be provided only with buffers and a robot as described above while a chamber that performs a certain process on a wafer is not provided.

Figure 5:
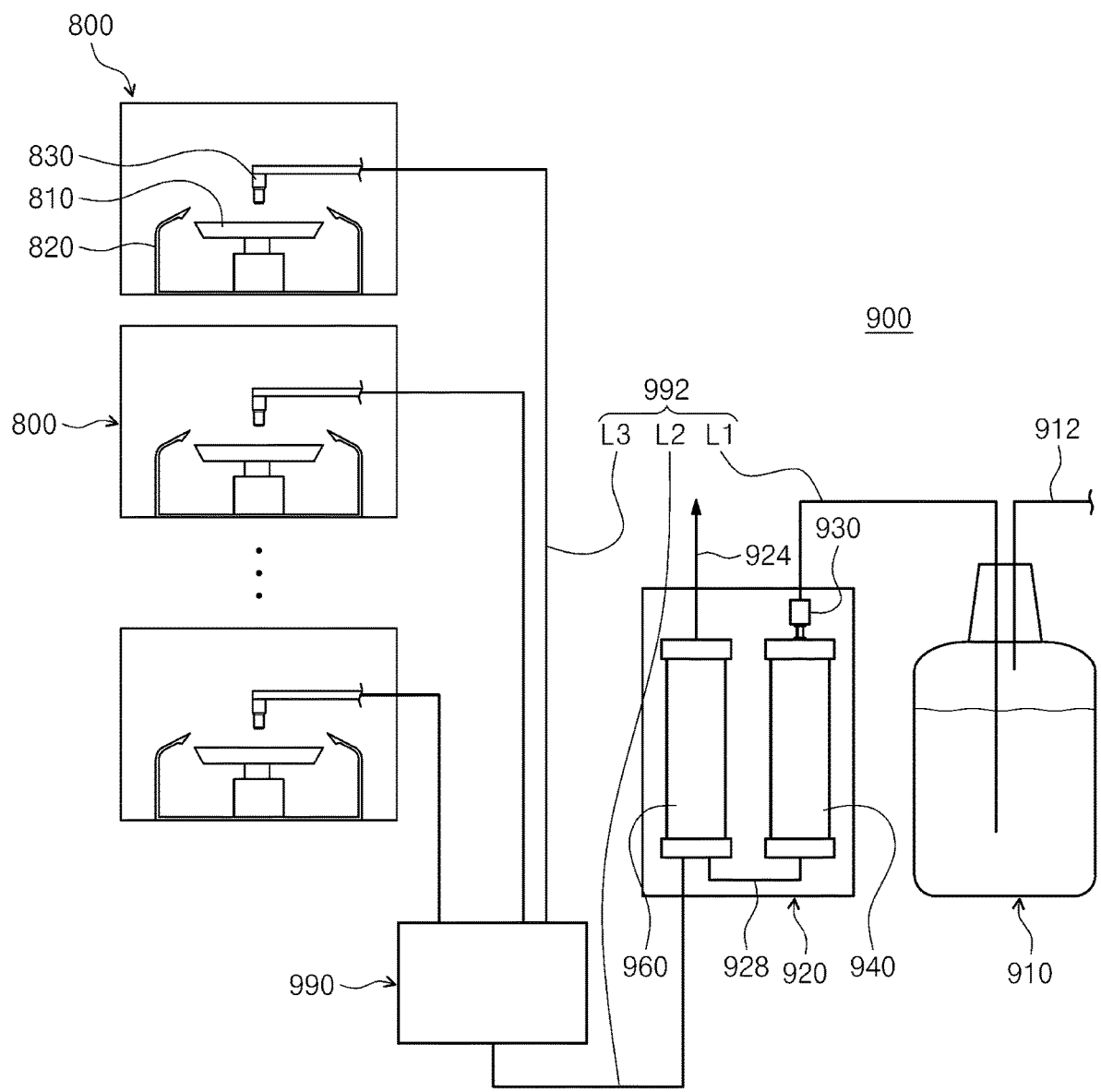
FIG. 5 is a view illustrating a treatment solution supply apparatus that supplies a treatment solution to resist applying chambers.

FIG. 5 is a view illustrating a treatment solution supply apparatus that supplies a treatment solution to resist applying chambers.

Although it is described in the present embodiment that a treatment solution supply apparatus 900 supplies a treatment solution used for an deposition process to resist applying chambers, the inventive concept is not limited thereto and may be applied to all solution treating apparatuses that treat surface of substrates by using a treatment solution. The resist applying chamber may provide a treatment solution to a solution treating apparatus 800 that performs a process of pre-wetting a substrate with a thinner composition, a process of applying a photoresist, and a process of cleaning an edge of the substrate with the thinner composition. Each of the solution treating apparatuses 800 may include a substrate support unit 810, a treatment container 820, and a nozzle 830.

Referring to FIG. 5, the treatment solution supply apparatus 900 may include a bottle 910, in which the treatment solution is stored, a degassing apparatus 920, a pump unit 990, and a supply pipeline 992.

The bottle 910 is filled with the treatment solution, and a first inert gas supply line 912 and a first supply line L1 are connected thereto. An inert gas (a helium gas or a nitrogen gas) is supplied to the bottle 910 through a regulator to make a closed interior of the bottle 910 an atmosphere of the inert gas, through the first inert gas supply line 912, and the treatment solution in the interior of the bottle 910 flows to the degassing apparatus 920 through the first supply line L1 with a relative pressure. Here, the treatment solution may be a thinner composition that is used for the pre-wetting process and the cleaning process.

Dissolved gases in the treatment solution may be separated and removed in the degassing apparatus 920. A second supply line L2 is connected to the degassing apparatus 920. The second supply line L2 is connected to the pump unit 990. An exhaust line 924 is connected to the degassing apparatus 920, and the exhaust line 924 is a line, through which the bubbles separated in the degassing apparatus 920 are exhausted.

The pump unit 990 may supply the treatment solution (the treatment solution, from which the dissolved gases have been removed) stored in the degassing apparatus 920 to the nozzles 830 of the solution treating apparatuses by a flow pressure generated due to a suction/discharge operation. Third supply lines L3 are connected to the pump unit 990. The third supply lines L3 may be connected to the nozzles 830 of the solution treating apparatuses.

The supply pipeline 992 may include the first supply line L1, the second supply line L2, and the third supply line L3.

Figure 6:
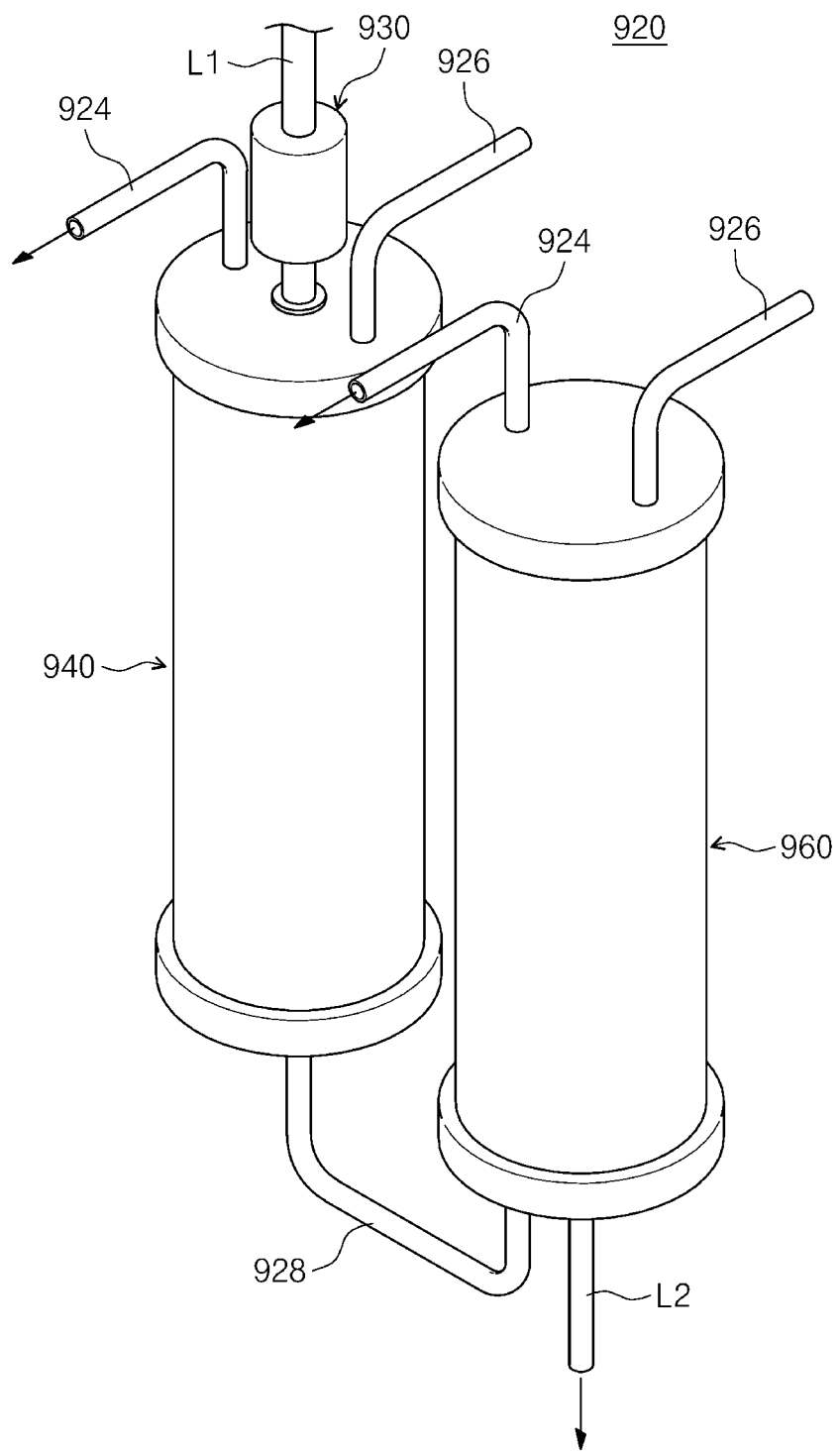
FIG. 6 is a perspective view illustrating a degassing apparatus illustrated in FIG. 5.
Figure 7:
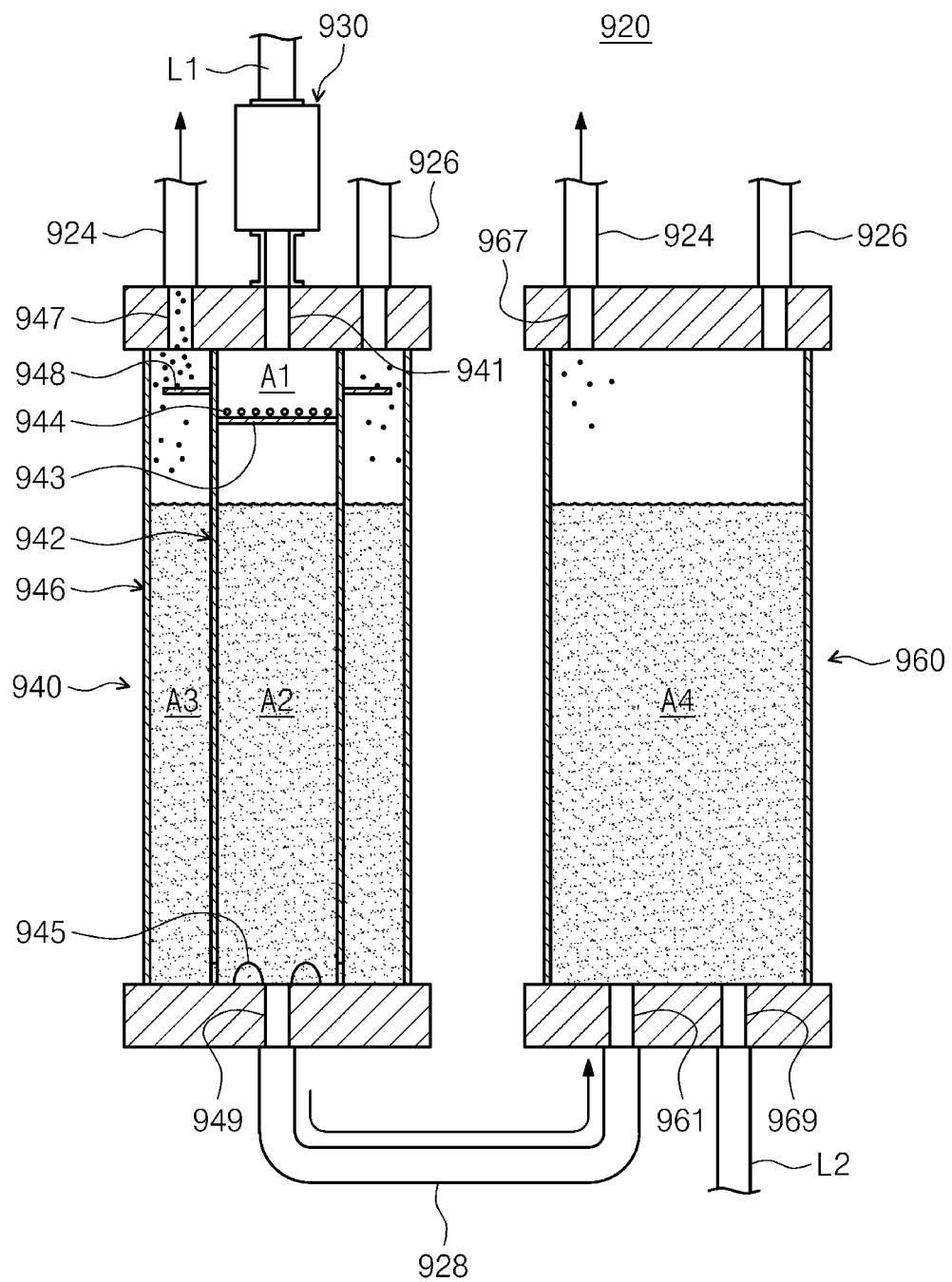
FIG. 7 is a cross-sectional view illustrating the degassing apparatus illustrated in FIG. 6.
Figure 8:
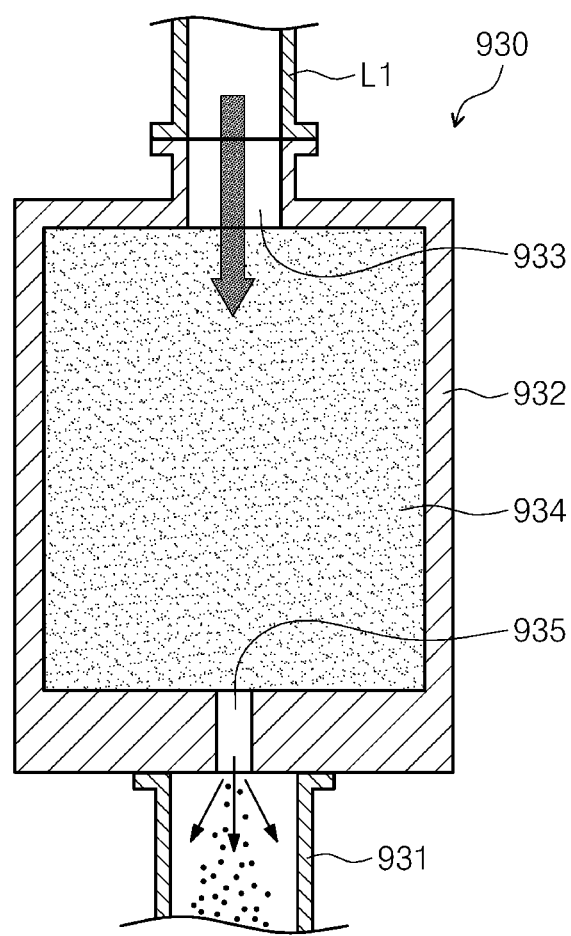
FIG. 8 is a view illustrating a dissolved gas extracting nozzle.

FIG. 6 is a perspective view illustrating the degassing apparatus illustrated in FIG. 5. FIG. 7 is a cross-sectional view illustrating the degassing apparatus illustrated in FIG. 6. FIG. 8 is a view illustrating a dissolved gas extracting nozzle.

Referring to FIGS. 5 to 8, the degassing apparatus 920 is an apparatus for separating and removing the dissolved gases in the treatment solution. As an example, the degassing apparatus 920 may include a dissolved gas extracting nozzle 930, a first tank 940, and a second tank 960.

The dissolved gas extracting nozzle 930 is a nozzle that extracts the dissolved gases from the treatment solution in a form of exhaustible bubbles. The dissolved gas extracting nozzle 930 may be installed close to a tip end (a first supply port) of the first tank 940 through a connection pipe 931.

The dissolved gas extracting nozzle 930 employs a manner of using a cavitation phenomenon, in which a pressure of a vapor pressure or less is generated by reducing a cross-section of an outlet 935 to be smaller than a cross-section of an intermediate passage 934 to increase flow velocity (a phenomenon, in which bubbles are generated due to a rapid pressure drop of the dissolved gases melt in the treatment solution). The dissolved gas extracting nozzle extracts the dissolved gases in the treatment solution in the form of the bubbles through the cavitation phenomenon when the treatment solution is discharged through the outlet.

The dissolved gas extracting nozzle 930 includes a nozzle body 932. An inlet 933 is provided at an upper end of the nozzle body 932, and the outlet 935 is provided at a lower end of the nozzle body 932, and the intermediate passage 934 is provided between the inlet 933 and the outlet 935.

In more detail, the treatment solution is discharged through the outlet 935 via the intermediate passage 934. When the treatment solution reaches the outlet 935, a flow velocity of the treatment solution increases, and a dynamic pressure of the treatment solution rapidly increases and a static pressure thereof rapidly decreases as well, and when the treatment solution passes through the outlet 935, the flow velocity of the treatment solution decreases, and the dynamic pressure of the treatment solution rapidly decreases and the static pressure thereof rapidly increases because the cross-section of the passage becomes wider. When a pressure of the treatment solution is rapidly changed, the cavitation phenomenon occurs, and the dissolved gases in the treatment solution are separated from the treatment solution while being extracted in the form of the bubbles. In this way, the bubbles extracted while passing through the dissolved gas extracting nozzle and the treatment solution are introduced into the first tank.

In this way, the degassing apparatus 920 extracts the dissolved gases in the form of the bubbles by using the cavitation phenomenon in the dissolved gas extracting nozzle 930, and may be used semi-permanently and does not cause separate maintenance costs.

The first tank 940 is a tank for separating and removing the extracted bubbles from the treatment solution while the bubbles pass through the dissolved gas extracting nozzle 930. According to an example, the first tank 940 may include a dual cylindrical structure including an inner case (hereinafter, a first case) 942 and an outer case (hereinafter, a second case) 946.

The first tank 940 has a first supply port 941, through which the treatment solution and the bubbles are introduced. As shown in FIG. 7, the first supply port 941 may be directly connected to the outlet 935 of the dissolved gas extracting nozzle 930.

The first case 942 may be partitioned into an upper space A1 and a lower space A2 by a horizontal partition wall 943. The upper space A1 is connected to the first supply port 941. The chemical, from which the bubbles have been removed, is stored in the lower space A2. The treatment solution and the bubbles in the upper space A1 flow to an outer space A3 of the second case 946 through a first flow passage 944. The first flow passage 944 is formed on a cylindrical partition wall corresponding to a body of the first case 942. When the treatment solution flows to the outer space through the first flow passage, a secondary cavitation phenomenon may occur.

The first case 942 has second flow passages 945 for flows of the chemical between the outer space A3 and the lower space A2. The second flow passages 945 may be located at a lower end of the first case 942. The second flow passages 945 may have a hemispherical shape.

The second case 946 has a cylindrical shape that surrounds the first case 942. The outer space A3 is formed between the first case 942 and the second case 946. The treatment solution and the bubbles are separated in the outer space A3. The bubbles flow to an upper portion of the outer space A3 and the treatment solution flows down to a lower portion thereof and is accumulated in the outer space A3 and the lower space A2. A first exhaust port 947 is configured to connect an upper end of the second case 946 and the outer space A3. The bubbles separated from the chemical in the outer space A3 are exhausted through the first exhaust port 947. The exhaust line 924 is connected to the first exhaust port 947. An exhaust pressure (or a negative pressure or a vacuum pressure) may be provided to the exhaust line 924.

Meanwhile, in the second case 946, a blocking plate 948 is installed at an upper portion of the outer space A3. The blocking plate 948 is configured to prevent the chemical introduced into the outer space A3 through the first flow passage 944 from being introduced into the first exhaust port 947. The blocking plate 948 may be installed in the outer space horizontally. The blocking plate 948 is located higher than the first flow passage 944.

The treatment solution, from which the bubbles have been removed in the first tank 940, is stored in the outer space A3 and the lower space A2, and is stored in a stabilization space A4 of the second tank 960 through a connection pipeline 928. The connection pipeline 928 is connected to a first discharge port 949 of the first tank 940 and a second supply port 961 of the second tank 960.

The second tank 960 has a cylindrical shape, and provides the stabilization space A4, in which the chemical, from which the bubbles have been separated in the first tank 940, to be stabilized. The second supply port 961 connected to the first discharge port 949 through the connection pipeline 928 and through the treatment solution, from which the bubbles have been separated is provided at a lower end of the second tank 960. A second exhaust port 967, through which the bubbles separated from the treatment solution stabilized in the stabilization space A4 is provided at an upper end of the second tank 960. The treatment solution stored in the stabilization space A4 is discharged through a second discharge port 969 provided at the lower end of the second tank 960. The second supply line L2 is connected to the second discharge port 969. The treatment solution fed to the second tank may be discharged after a stabilization time.

Meanwhile, each of the first tank 940 and the second tank 960 has a compression port, through which the compressed air for compressing an interior thereof is provided, and a compression line 926 may be connected to the compression port. The interiors of the first and second tanks are compressed when the treatment solution stored in the interior spaces is to be evacuated for maintenance of the tanks.

According to the degassing apparatus 920 having the above-described configuration, the dissolved gases are extracted in the dissolved gas extracting nozzle 930, the bubbles are separated and removed in the first tank 940, and the treatment solution, from which the bubbles have been removed, is stabilized in the second tank 960. In particular, the degassing apparatus 920 includes the first tank 940 and the second tank 960 to be free from limitation of flow rates, and thus, may be disposed at a front end (supply part) of the pump unit 990 instead of the front end of the nozzle. Accordingly, as compared with the conventional technology of individually disposing degassing apparatuses in supply lines connected to nozzles, spaces and costs may be reduced.

Figure 9:
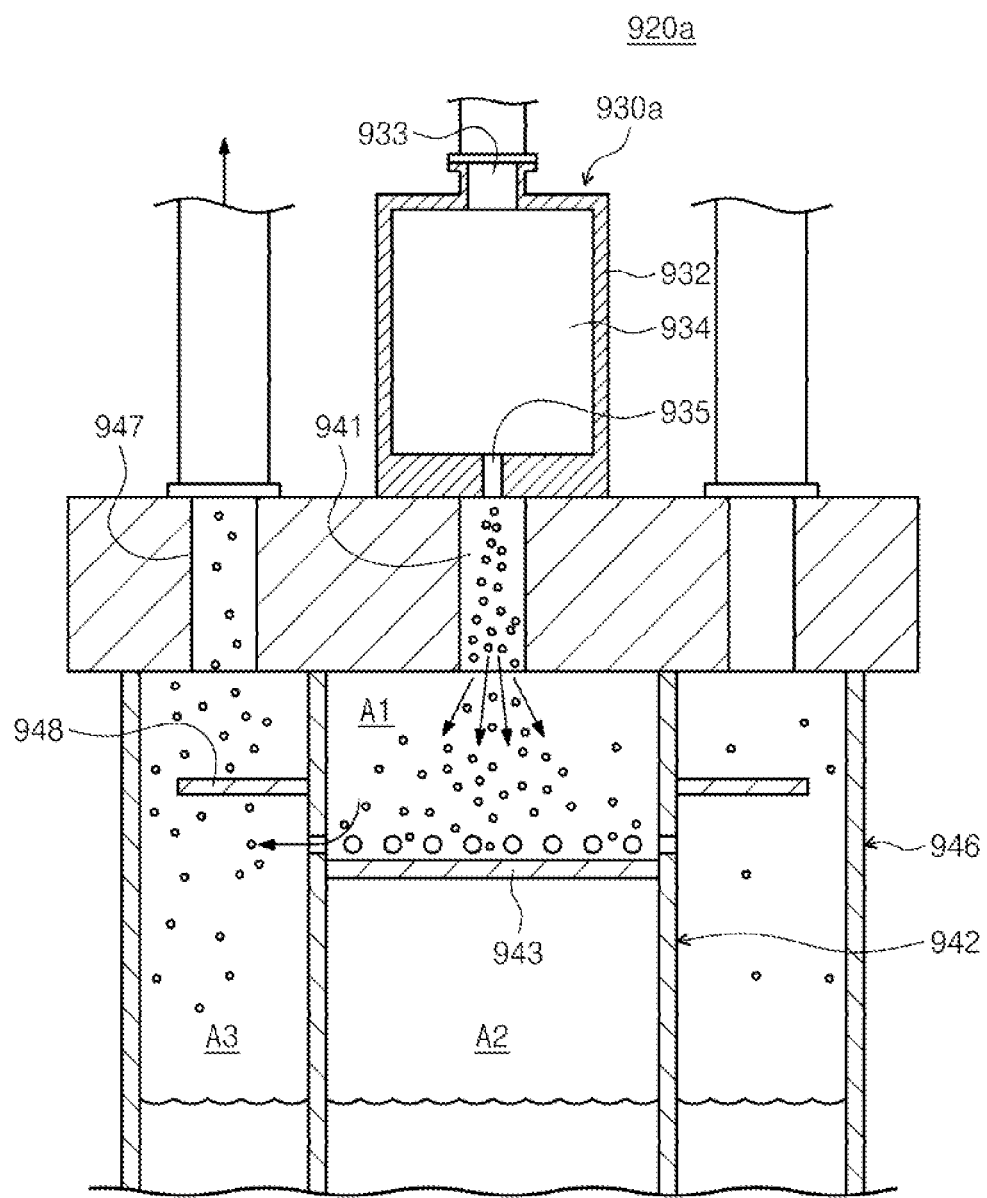
FIG. 9 is a view illustrating a first modification of the degassing apparatus.

FIG. 9 is a view illustrating a first modification of the degassing apparatus.

A degassing apparatus 920a illustrated in FIG. 9 includes a dissolved gas extracting nozzle 930a, a first tank 940a, and a second tank (not illustrated), which have configurations and functions that are substantially similar to those of the dissolved gas extracting nozzle 930, the first tank 940, and the second tank 960 illustrated in FIG. 7, and thus a modification will be described mainly with reference to a difference from the present embodiment in the following.

In the modification, the dissolved gas extracting nozzle 930a may be installed such that the outlet 935 is directly connected to the first supply port 941 of the first tank 940a.

Figure 10:
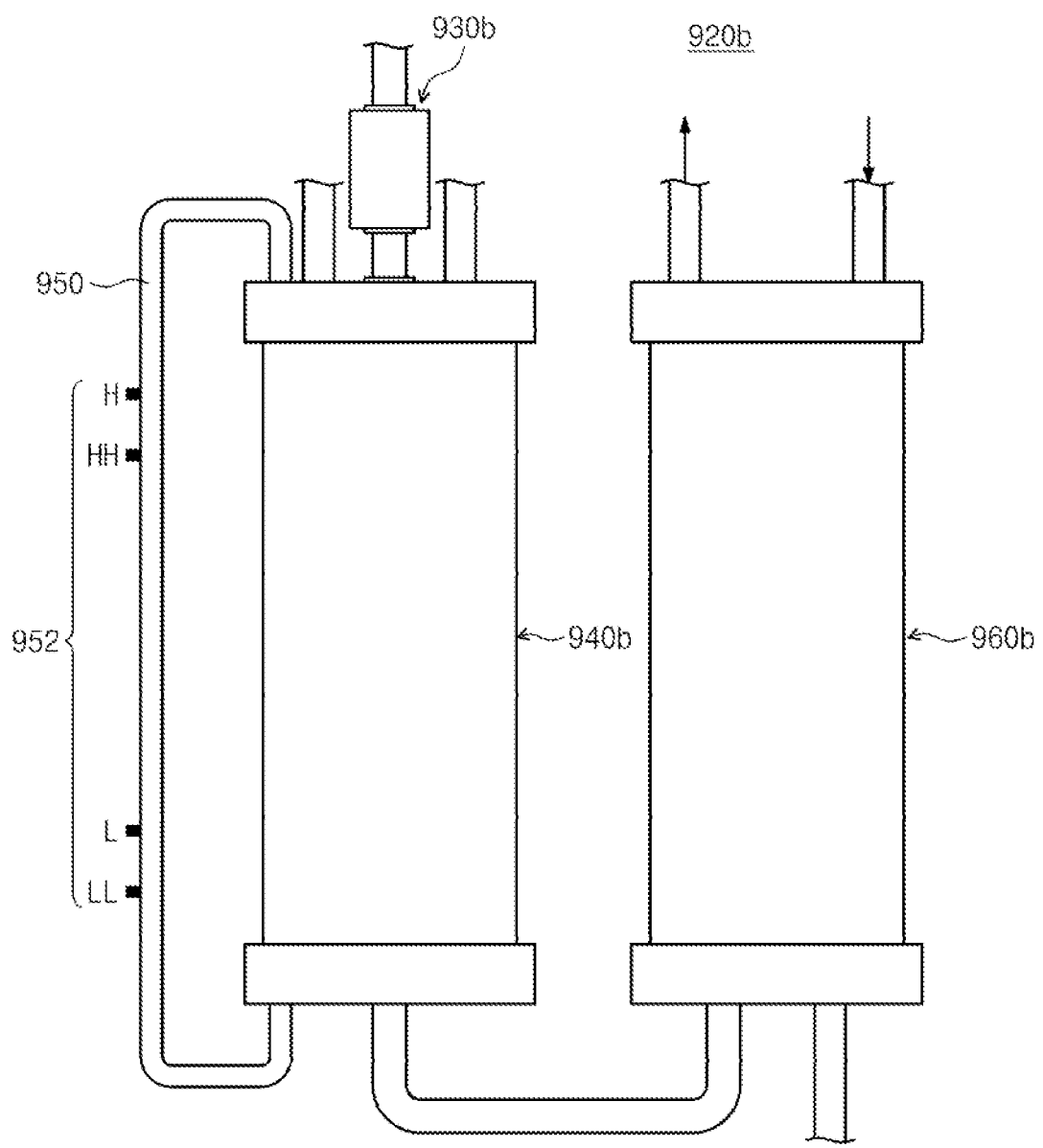
FIG. 10 is a view illustrating a second modification of the degassing apparatus.
Figure 11:
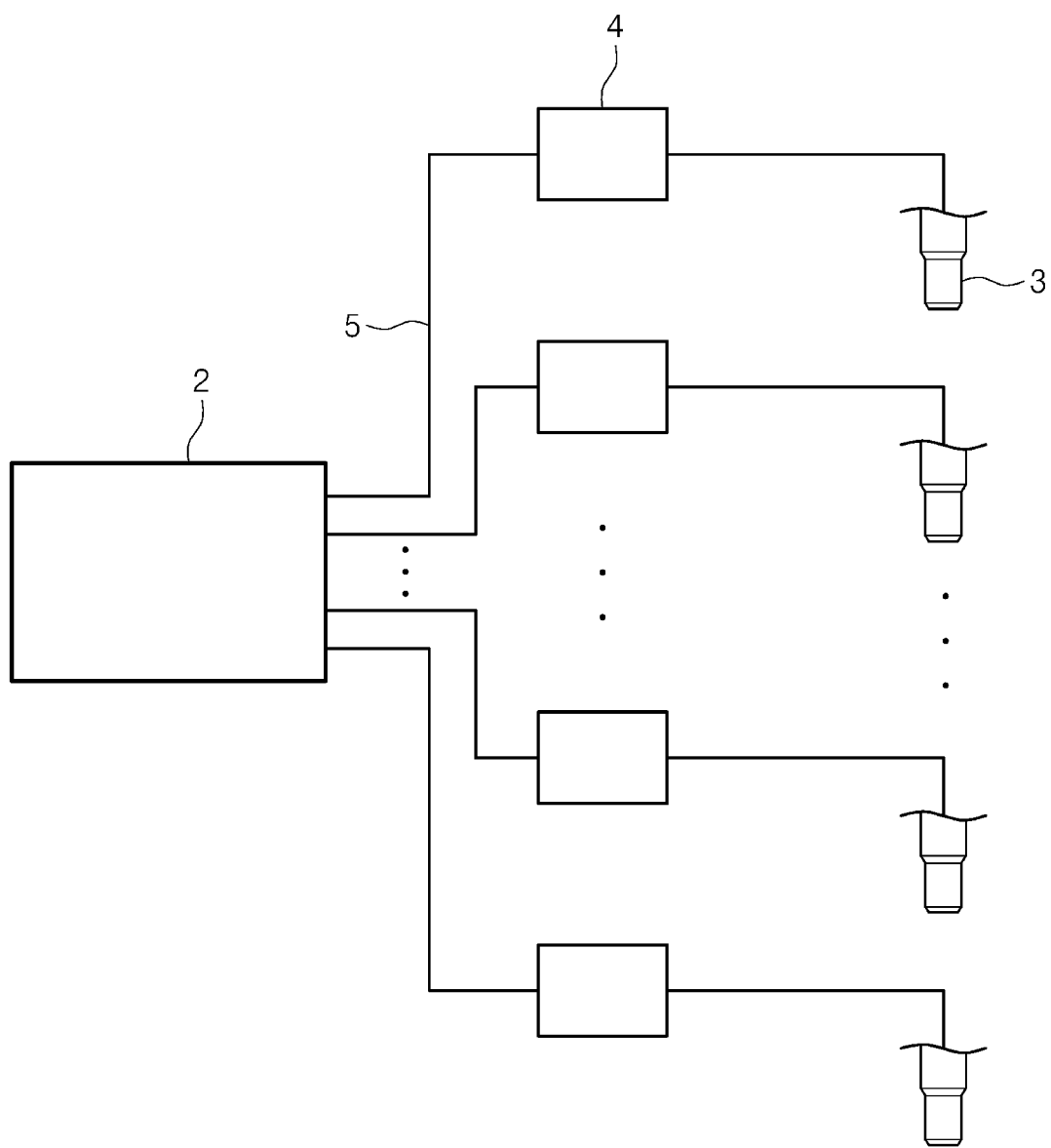
FIG. 11 is a view illustrating a treatment solution supply apparatus in a treatment apparatus that performs a general deposition process.

FIG. 10 is a view illustrating a second modification of the degassing apparatus.

A degassing apparatus 920b illustrated in FIG. 10 includes a dissolved gas extracting nozzle 930b, a first tank 940b, and a second tank 960b, which have configurations and functions that are substantially similar to those of the dissolved gas extracting nozzle 930, the first tank 940, and the second tank 960 illustrated in FIG. 7, and thus a modification will be described mainly with reference to a difference from the present embodiment in the following.

In the modification, level sensors 952 may be installed on one side of the first tank 940b to detect a level of the treatment solution to manage the treatment solution such that the level of the treatment solution may be continuously filled up to a suitable level (e.g., at H as shown in FIG. 10). As an example, the first tank 940b may include a level indicating tube 950 communicated with the outer space A3, and the level sensor 952 that is located on one side of the level indicating tube 950 to measure the level of the treatment solution. Four level sensors 952 may be disposed at four sites to measure four levels of the treatment solution (e.g., at HH, H, L, and LL as shown in FIG. 10).

According to the embodiment of the inventive concept, because the degassing apparatus includes the first tank and the second tank, the flow rate is free from limitation of flow rates, and thus, may be disposed at a front end (supply unit) of a pump unit instead of a front end of a nozzle. Accordingly, as compared with the conventional technology of individually disposing degassing apparatuses in supply lines connected to nozzles, spaces and costs may be reduced.

According to the embodiment of the inventive concept, because the dissolved gases are extracted in the form of bubbles by using a cavitation phenomenon in the dissolved gas extracting nozzle, the dissolved gas extracting nozzle may be used semi-permanently and separate maintenance costs are not caused.

According to the embodiment of the inventive concept, the dissolved gases in the treatment solution may be effectively extracted to be separated and removed.

According to the embodiment of the inventive concept, a sufficient flow rate may be supplied.

The effects of the inventive concept are not limited to the above-described ones. Unmentioned effects will be clearly understood from the specification and the accompanying drawings by those skilled in the art to which the inventive concept pertains.

It is noted that the above embodiments are suggested for understanding of the inventive concept and do not limit the scope of the inventive concept, and various modifiable embodiments also fall within the scope of the inventive concept. It should be understood that the technical protection range of the inventive concept has to be determined by the technical spirit of the claims, and the technical protection range of the inventive concept is not limited to the lexical meaning of the claims but reaches even to the equivalent inventions.

What is claimed is:

1. A degassing apparatus installed on a treatment solution supply line, the degassing apparatus comprising:
    a dissolved gas extracting nozzle configured to extract dissolved gases in a form of bubbles from a treatment solution including the dissolved gases; and
    a first tank configured to separate the bubbles extracted while passing through the dissolved gas extracting nozzle from the treatment solution;
    wherein the first tank includes:
    a first supply port provided at an upper end thereof, and through which the treatment solution and the bubbles are introduced;
    a first case having an upper space connected to the first supply port;
    a second case configured to surround the first case, and having an outer space, in which the treatment solution and the bubbles introduced from the upper space are separated, therebetween; and
    a first exhaust port located at an upper end of the outer space, and through which the bubbles separated from the treatment solution are exhausted from the outer space.

2. The degassing apparatus of claim 1, wherein the dissolved gas extracting nozzle is configured such that a diameter of an intermediate passage connecting an inlet and an outlet thereof is larger than diameters of the inlet and the outlet.

3. The degassing apparatus of claim 1, wherein the dissolved gas extracting nozzle includes:
    a body having an intermediate passage, through which the treatment solution flows, in an interior thereof, an inlet, through which the treatment solution is introduced, on one side of the intermediate passage, and an outlet, through which the treatment solution is discharged, on an opposite side of the intermediate passage, and
    wherein an outlet has a cross-section that is smaller than a cross-section of the intermediate passage such that the dissolved gases in the treatment solution are extracted in the form of the bubbles through a cavitation phenomenon.

4. The degassing apparatus of claim 1, wherein the first case includes:
    first flow passages, through which the treatment solution and the bubbles flow from the upper space to the outer space;
    a lower space partitioned by a horizontal partition wall below the upper space, and in which the treatment solution, from which the bubbles have been removed, is stored from the outer space; and
    second flow passages, through which the treatment solution flows between the outer space and the lower space, at a lower end of a vertical partition wall that partitions the lower space and the outer space.

5. The degassing apparatus of claim 1, wherein the first tank further includes:
    a first discharge port, through which the treatment solution is discharged from a lower space, and
    the second case further includes:
    a blocking plate installed in the outer space in a horizontal direction such that the treatment solution introduced into the outer space through a first flow passages is not introduced into the first exhaust port.

6. The degassing apparatus of claim 1, further comprising:
    a second tank having a stabilization space, in which the treatment solution, from which the bubbles have been separated, is stored from the first tank and is stabilized.

7. The degassing apparatus of claim 6, wherein the second tank includes:
    a second supply port provided at a lower end thereof, and through which the treatment solution, from which the bubbles have been separated, is introduced from the first tank;
    a second exhaust port provided at an upper end thereof, and through which bubbles separated from the treatment solution stabilized in the stabilization space are exhausted; and
    a second discharge port provided at a lower end thereof, and through which the treatment solution stored in the stabilization space is discharged.

8. A degassing apparatus installed on a treatment solution supply line, the degassing apparatus comprising:
    a dissolved gas extracting nozzle configured to extract dissolved gases in a form of bubbles from a treatment solution including the dissolved gases;
    a first tank configured to separate the bubbles extracted while passing through the dissolved gas extracting nozzle from the treatment solution; and
    a second tank having a stabilization space, in which the treatment solution, from which the bubbles have been separated, is stored from the first tank and is stabilized,
    wherein the dissolved gas extracting nozzle is configured such that a diameter of an outlet is smaller than a diameter of an intermediate passage such that the dissolved gases in the treatment solution are extracted in the form of the bubbles through a cavitation phenomenon.

9. The degassing apparatus of claim 8, wherein the first tank includes:
    a first supply port provided at an upper end thereof, and through which the treatment solution and the bubbles are introduced;
    a first case having an upper space connected to the first supply port, and a lower space, in which the treatment solution, from which the bubbles have been removed, is stored from an outer space;

a second case configured to surround the first case, and having the outer space, in which the treatment solution and the bubbles introduced from the upper space is separated, therebetween;

a first exhaust port located at an upper end of the outer space, and through which the bubbles separated from the treatment solution are exhausted from the outer space; and a first discharge port provided at a lower end thereof, and through which the treatment solution stored in the lower space is discharged, and wherein the first case includes:

first flow passages, through which the treatment solution and the bubbles flow from the upper space to the outer space; and second flow passages, through which the treatment solution flows between the outer space and the lower space, at a lower end of a vertical partition wall that partitions the lower space.

10. The degassing apparatus of claim 9, wherein the second case further includes:

a blocking plate installed in the outer space in a horizontal direction such that the treatment solution introduced into the outer space through the first flow passages is not introduced into the first exhaust port.

11. The degassing apparatus of claim 9, wherein the second tank includes:

a second supply port provided at a lower end thereof, connected to the first discharge port through a connection pipeline, and through which the treatment solution, from which the bubbles are separated, is introduced;

a second exhaust port provided at an upper end thereof, and through which the bubbles separated from the treatment solution stabilized in the stabilization space are exhausted; and a second discharge port provided at a lower end thereof, and through which the treatment solution stored in the stabilization space is discharged.

12. A substrate treating apparatus comprising:

treatment apparatuses configured to treat a substrate by using a treatment solution; and a treatment solution supply unit configured to supply the treatment solution to nozzles of the treatment apparatuses, wherein the treatment solution supply unit includes:

a bottle, in which the treatment solution is stored;

a degassing apparatus having a dissolved gas extracting nozzle configured to extract dissolved gases from the treatment solution received from the bottle in a form of bubbles; and a pump configured to supply the treatment solution stored in the degassing apparatus, from which the dissolved gases have been separated, to the nozzles of the treatment apparatuses;

wherein the degassing apparatus includes:

a first tank configured to separate the bubbles extracted while passing through the dissolved gas extracting nozzle from the treatment solution;

a second tank having a stabilization space, in which the treatment solution, from which the bubbles have been separated in the first tank, is stored and is stabilized; and a connection pipeline connecting a lower end of the first tank and a lower end of the second tank.

13. The substrate treating apparatus of claim 12, wherein the dissolved gas extracting nozzle is configured such that a diameter of an intermediate passage connecting an inlet and an outlet thereof is larger than diameters of the inlet and the outlet.

14. The substrate treating apparatus of claim 12, wherein the first tank includes:

a first supply port provided at an upper end thereof, and through which the treatment solution and the bubbles are introduced;

a first case having an upper space connected to the first supply port, and a lower space, in which the treatment solution, from which the bubbles have been removed, is stored from an outer space;

a second case configured to surround the first case, and having the outer space, in which the treatment solution and the bubbles introduced from the upper space is separated, therebetween; and a first exhaust port located at an upper end of the outer space, and through which the bubbles separated from the treatment solution are exhausted from the outer space, and wherein the first case includes:

first flow passages, through which the treatment solution and the bubbles flow from the upper space to the outer space; and second flow passages, through which the treatment solution flows between the outer space and the lower space, at a lower end of a vertical partition wall that partitions the lower space.

15. The substrate treating apparatus of claim 14, wherein the first tank further includes:

a first discharge port, through which the treatment solution is discharged from the lower space, and wherein the second case further includes:

a blocking plate installed in the outer space in a horizontal direction such that the treatment solution introduced into the outer space through the first flow passages is not introduced into the first exhaust port.

16. The substrate treating apparatus of claim 12, wherein the second tank includes:

a second supply port provided at a lower end thereof, and through which the treatment solution, from which the bubbles are separated, is introduced from the first tank;

a second exhaust port provided at an upper end thereof, and through which the bubbles separated from the treatment solution stabilized in the stabilization space are exhausted; and a second discharge port provided at a lower end thereof, and through which the treatment solution stored in the stabilization space is discharged.

* * * * *